United States Patent [19]

Elchisak

[11] 4,015,029
[45] Mar. 29, 1977

[54] SELENIUM AND SELENIUM ALLOY EVAPORATION TECHNIQUE

[75] Inventor: John J. Elchisak, Webster, N.Y.

[73] Assignee: Xerox Corporation, Stamford, Conn.

[22] Filed: June 27, 1975

[21] Appl. No.: 590,972

[52] U.S. Cl. .................................. 427/76; 427/74; 427/75; 427/248 R; 427/248 A; 427/248 B; 427/294; 427/295; 432/262; 432/264; 432/265; 432/156

[51] Int. Cl.² .................. C23C 11/00; F27B 14/10

[58] Field of Search ............ 252/501; 427/76, 248, 427/248 R, 248 A, 248 B, 74, 75, 294, 295; 432/156, 262, 264, 265; 250/338; 96/1.5

[56] References Cited

UNITED STATES PATENTS

| | | |
|---|---|---|
| 2,739,079 | 3/1956 | Bixby et al. .................. 427/76 |
| 2,753,278 | 7/1956 | Keck ................................ 427/76 |
| 2,937,353 | 5/1960 | Wasserman ....................... 252/501 |
| 3,151,982 | 10/1964 | Corrsin .............................. 252/501 |
| 3,510,298 | 5/1970 | Lane ................................. 252/501 |
| 3,554,512 | 1/1971 | Elliot ................................ 432/156 |
| 3,655,376 | 4/1972 | Wood ................................ 252/501 |
| 3,745,504 | 7/1973 | Mooney ............................. 252/501 |
| 3,830,648 | 8/1974 | Rutherford ....................... 252/501 |
| 3,909,458 | 9/1975 | Schottmiller ..................... 252/501 |

Primary Examiner—Michael F. Esposito
Attorney, Agent, or Firm—James J. Ralabate; James P. O'Sullivan; John E. Crowe

[57] ABSTRACT

A coating composition and method for vacuum coating inorganic photoconductive material onto a suitable substrate or backing through utilization of the compositions and irradiation heating devices.

12 Claims, 6 Drawing Figures

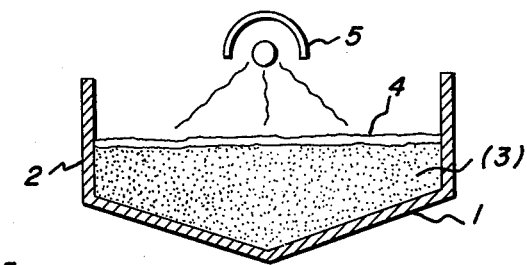
FIG. I
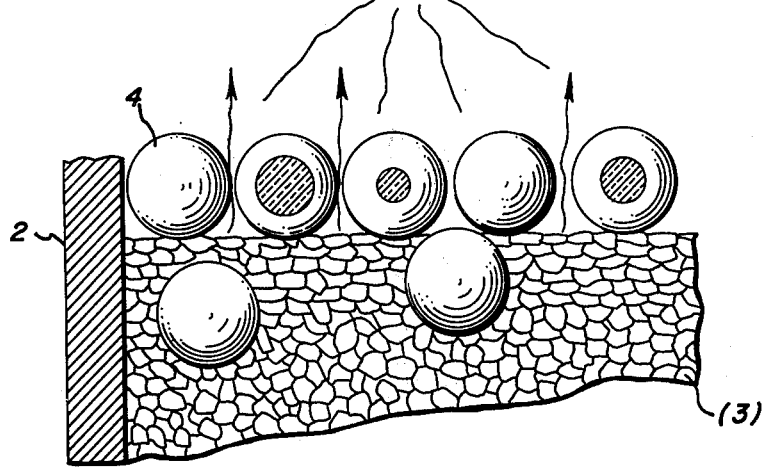
FIG. II
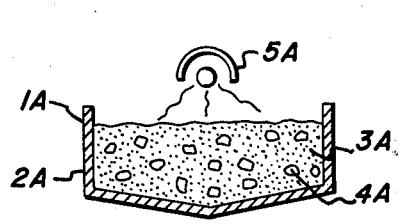
FIG. III
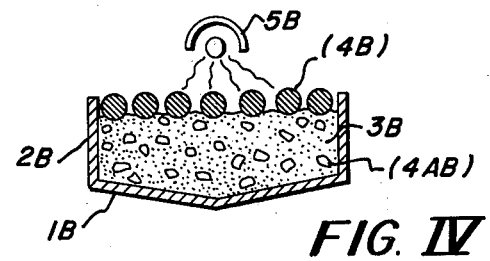
FIG. IV
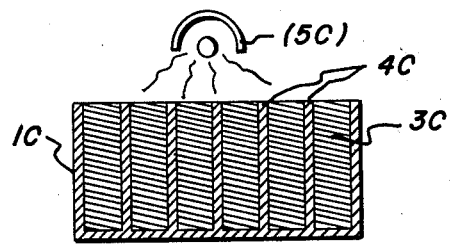
FIG. V
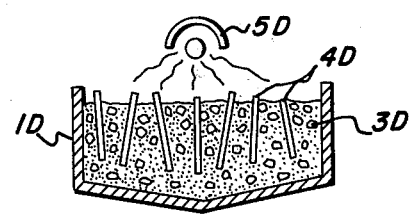
FIG. VI

SELENIUM AND SELENIUM ALLOY EVAPORATION TECHNIQUE

This invention is directed generally to a vaporizable photoconductive composition and a method for more efficiently vacuum coating inorganic photoconductive materials therein onto a suitably prepared xerographic substrate or base, utilizing an irradiation heating device.

BACKGROUND

It is customary in the xerographic art to form an electrostatic latent image on a photoreceptor drum or plate comprising a charge conductive backing such as, for example, a metallic or metal-coated base having an inorganic photoconductive insulating layer applied thereto in good charge blocking contact. Suitable plates or drums can comprise, for example, an aluminum surface having a thin layer of vitreous selenium and an aluminum oxide and/or polymeric interlayer. Such elements are characterized by being capable of accepting a suitable electrostatic charge and of quickly and selectively dissipating a substantial part of the charge where light is exposed. In general, photoreceptors containing such elements are sensitive to light in the blue-green spectral range.

While selenium containing photoconductive elements are usefully employed in commercial xerography, there has been room for substantial improvement in photoconductive properties such as the range of spectral response, heat and charge stability, etc. These can be improved, for instance, by the addition of various photoconductive alloys, alloying elements or other types of additives (ref. U.S. Pat. Nos. 2,803,542 and 2,822,300). In particular, the addition of various amounts of arsenic can result in a broader range of spectral sensitivity and improve overall photographic speed and stability. Suitable alloys or homogeneous mixtures of elemental selenium with other metals suitable for this purpose can be incorporated into the usual photoconductive material and applied by conventional vacuum evaporation techniques. For example, additional inorganic coating materials can be placed in open or shuttered crucibles during an initial coating step. The xerographic substrate upon which the photoconductive material is to be deposited is conveniently placed above or in some other convenient location with respect to the potential coating vapor source. After the container has been evacuated to a suitable pressure (about $5 \times 10^{-5}$ Torr), the vessel containing photoconductive material and/or additive is then generally heated by electric resistance to promote vaporization of the material. At least some of the vaporized material then condenses on the relatively cool substrates; such a deposition process normally requires a period of about 15–60 minutes, depending upon the amount of substrate surface to be coated and the desired thickness of coating material.

From time to time it is also found desirable to apply profile concentrations of one or more photoconductive components or separate layers of different photoconductive materials to obtain a particular desired spectrum of characteristics. In such case, the respective photoconductive materials or alloys are most conveniently applied to substrates or bases by coevaporation techniques, in which predetermined amounts of the respective photoconductive materials or alloys are placed in separate crucibles or in subdivided crucibles and exposed or heated in a predetermined sequence under vacuum. One possible modification for this purpose involves coating substrates in the presence of one or a plurality of elongated shuttered or unshuttered crucibles heated by electrical heating elements or by other conventional means, the crucibles being subdivided into a plurality of compartments or bins, each capable of carrying different pre-measured amounts and kinds of coating materials depending upon the desired final concentration. Another possible modification involves the formation of one or more trains of smaller crucibles temporarily connected to each other and containing various photoconductive materials. Both arrangements are found to be very useful in coating a plurality of substrates simultaneously with a plurality of components.

The modifications above described are very useful, however, there are serious economic and technical limitations inherent in their use. For instance, it is very difficult to maintain and efficiently operate mechanical devices such as crucible shutters for batch coating purposes due to sticking caused by the random condensation of photoconductive material within the vacuum coater, the poisonous nature of the material and the environment which must be maintained during coating. The alternative of using weighed amounts of each desired component in a plurality of open, self-heating crucibles offers a partial solution to the problem except for the substantial expenditure of time and money required to fill a plurality of crucibles with different amounts of different photoconductive materials or components thereof during each batch coating operation. In addition, it is difficult to avoid contamination and to control spattering in a timed evaporation sequence due to uneven heat distribution or hot spots of a generally unpredictable nature within individual crucibles and their contents.

The mechanical problems noted above can be avoided substantially by the use of one or more open crucibles and a timed heating sequence, preferably with irradiation heating devices such as infra red heat sources; but this is only a partial solution to the overall problem. A number of inorganic photoconductive materials, including selenium and many useful alloys of selenium are transparent or at least partially transparent to light of the longer wavelengths such as infra red. As a result, the crucible walls and bottom plus various hot spots within each crucible charge will heat up much faster than the top. This not only results in the inefficient use of energy input due to secondary radiation from the crucible walls and bottom, but may actually result in small explosions due to the buildup of gases and cause serious spattering of the coating material with resulting defects on the surfaces being vacuum coated.

It is an object of the present invention to more efficiently control vacuum coating of vaporizable inorganic materials or components thereof onto prepared surfaces or bases.

It is a further object to more efficiently utilize the radiant energy input in batch coating involving vacuum deposition of one or more vaporizable inorganic photoconductive materials.

It is a still further object to substantially limit or avoid spattering while vacuum depositing one or more selenium or tellurium containing photoconductive materials while utilizing longwave radiation substantially in the infra red region of the spectrum.

THE INVENTION

The above objects are achieved in accordance with the present invention by incorporating up to about 80% inclusive of 1–80% and preferably about 3–50% by weight of at least one non-volatile infra red absorbing heat sink material inclusive of silica such as quartz, also nickel, stainless steel or ceramic beads, pellets or particles substantially incorporated on or within the body of said inorganic photoconductive material or components thereof prior to effecting evaporation of the materials or components.

Preferably the vaporizable inorganic photoconductive material utilized for this purpose is in the form of discrete particles or pellets which can be uniformly or non-uniformly admixed with the infra red absorbing heat sink material or otherwise present in the form of a cast. In the former, the infra red absorbing heat sink material can also be present in the form of discrete particles or even as shaped pieces which can be uniformly or non-uniformly admixed alone or in combination with the photoconductive material. When the crucible charge material is non-uniformly admixed, it is found particularly useful to employ relatively large discrete particles or shaped pieces of the infra red heat sink material compared with the particles of photoconductive material. In any case, the heat sink material can usefully be uniformly incorporated into the photoconductive material in whatever form, applied on top of the material as particles or shaped pieces such as rods, particularly as insert members non-uniformly embedded into the material, or a combination thereof. When present as a plurality of non-volatile infra red absorbing insert members it is found that they can be arranged at an angle of 90° or less to the horizontal and at least partly embedded in the inorganic photoconductive charge. In either case, the object of the invention is best achieved if the upper surface of the crucible or a substantial part of the upper half of the crucible charge can be evenly heated by absorption of infra red or similar radiation and the resulting heat rapidly transferred by conduction to the adjacent photoconductive or other material, whether in particulate or other form, to effect rapid evaporation and also to permit rapid cooling as soon as the heating means is turned off.

The invention, as above described, is further exemplified in FIGS. I–VI in which embodiments are shown in diagrammatic cross section, FIG. II being fragmentary and enlarged for purposes of clarification of FIG. I.

FIG. I represents a crucible 1 consisting of walls and bottom 2 of the usual type containing a charge consisting of vaporizable inorganic photoconductive material 3 inclusive of amorphous selenium, tellurium or alloy thereof such as an alloy with arsenic and/or a halogen; a layer or loose covering of particles of an infra red absorbing heat sink material 4 and at least one irradiation heating means such as an infra red source 5 correspondingly identified as 5A–5D in FIGS. III–VI below.

FIG. II represents a fragmentary enlarged view of FIG. I showing a random surface distribution of infra red absorbing material 4 generally overlaying smaller particles of photoconductive material 3.

FIG. III shows a uniform distribution of infra red absorbing particles 4A among smaller photoconductive particles 3A. The remaining parts correspond in number to that of FIGS. I–II but with the connotation A.

FIG. IV represents a crucible similar to that of FIG. III with correspondingly numbered parts but with the connotation B, at least some of the infra red absorbing material being present in the form of optionally interconnected rods 4B loosely laid on the upper surface of the photoconductive material 3B as well as admixed infra red absorbing material 4AB.

FIG. V represents another useful embodiment in which at least some infra red absorbing material is in the form of vertical baffles or projections 4C and the photoconductive material is optionally in the form of an alloy melt or cast 3C in crucible 1C.

FIG. VI represents a still further modification in which rods of suitable infra red absorbing material 4D are randomly embedded in the particulate photoconductive material 3D, the remaining identifying numbers corresponding to FIG. I but with the connotation D.

For purposes of the present invention, the inorganic photoconductive material can include selenium, selenium alloys inclusive of alloys of selenium with tellurium, germanium, antimony, bismuth and arsenic and/or one or more halogens such as chlorine, bromine and iodine. Materials of this type are further listed, for instance, in U.S. Pat. Nos. 2,803,542, 2,970,906, 3,490,903, 3,312,548 and 3,532,496 and here incorporated by reference.

Crucibles suitable for use in accordance with the present invention are generally open and consist of heat resistant materials non-contaminating materials such as ceramic, stainless steel or comparable materials able to withstand temperatures up to about 400° C or above under vacuum. In addition, the relative infra red light-absorbing properties are preferably less or do not substantially exceed that of the infra red absorbing heat sink material being utilized.

The following examples specifically demonstrate preferred embodiments of the present invention without limiting it thereby.

EXAMPLE I

A mixture of 500 gm arsenic, about 9500 grams of selenium, and 1000 ppm chlorine are placed in a glass reactor at 525° C for about 3 hours. After cooling, the resulting selenium alloy is recovered, ground and divided into three equal amounts, two aliquots being transferred into identical 2×5 inch stainless steel crucibles identified as T1 and T2, respectively. About 3% by sample weight of coarse quartz particles is then sprinkled evenly onto the top of the crucible charges in crucible T2 while T1 is maintained as a control. The third aliquot is then thoroughly blended with 50% by sample weight of the same grade of quartz crystals as used in sample T2 and 66.6% by weight of the blend is evenly placed into an identical third crucible identified as T3. Two thermocouples are then attached externally at the bottom (center) of each crucible and the crucibles placed in a vacuum coater about 3 inches below and axially parallel to an infra red source (i.e. an emitting wire). The coater is evacuated to $5 \times 10^{-5}$ Torr ar the infra red source simultaneously activated until crucible T1 (the control) reaches a temperature of 270° C. The temperature of crucibles T2 and T3 are then noted as a functional measure of the relative amount of infra red absorption of the respective crucible charges. The results are reported in Table I below.

TABLE I

| Crucible | Temp °C (*) |
|---|---|
| T1 (control) | 270° |
| T2 | 235° |
| T3 | 245° |

(*) average temperature

EXAMPLE II

Example I is repeated with three crucibles identified respectively as T4–T6 except that the three crucibles are placed within 2 inches of the IR emitting wire and three 2×5 inches aluminum foil strips are mounted about 3 inches above each crucible and slightly to one side; after the control crucible reaches 270° C, the infra red source is regulated to maintain this temperature in crucible T4 for 30 minutes. At the end of this period, the infra red source is turned off and the coater permitted to return to ambient temperature and pressure. The respective strips identified respectively as S4, S5 and S6 are then removed and inspected by hand lens and for evenness of depth of photoconductor coating and the presence of defects. The results are reported in Table II below.

TABLE II

| Sample | Coating Evaluation* |
|---|---|
| S4 (control) | F |
| S5 | VG |
| S6 | EX |

*F = fair (two or more observable surface defects plus some unevenness of coating)
G = good (no more than one defect but an uneven photoconductive coating)
VG = very good (no surface defects observed and a generally even coating)
EX = excellent (no surface defects observed and no significant difference in coating depth discernable)

EXAMPLE III

A photoconductive selenium/arsenic alloy identical with that of Example I is obtained as before and divided into three aliquots. The first and second aliquots are placed into identical stainless steel crucibles identified as T7 and T8 and the third is thoroughly admixed with 80% by sample weight of the same grade of coarse crystals as used in crucible T3 of Example I. Fifty-five and a half percent by weight of the admixture is then put into an identical crucible identified as T9. Four stainless steel pins about 4 inches long and ⅛ inch OD are then laid onto the charge in T8 in parallel axial arrangement evenly with respect to the main crucible axis. The crucibles are then placed in a vacuum coater and the bottom crucible temperature monitored with thermocouples as before. When the control crucible (T7) reaches 270° C the respective temperatures of T8 and T9 are noted and the results reported in Table III below.

TABLE III

| Crucible | Temp °C |
|---|---|
| T7 (control) | 270 |
| T8 | 246 |
| T9 | 248 |

What is claimed is:

1. A method for limiting spattering while vacuum coating one or more vaporizable inorganic photoconductive materials or components thereof onto one or more prepared substrates or bases in conjunction with at least one infra red heating device comprising incorporating 1–80% by weight of at least one non-volatile infra red absorbing heat sink material on or within the body of said inorganic photoconductive material or components thereof prior to effecting evaporation of the materials or components.

2. The method of claim 1 wherein the vaporizable inorganic photoconductive material is in the form of discrete particles or pellets, and the non-volatile infra red absorbing heat sink material is present in the amount of about 1–80% by weight.

3. The method of claim 1 wherein the vaporizable inorganic photoconductive material is in the form of a cast, the non-volatile infra red-absorbing heat sink material being present in the amount of about 1–80% by weight.

4. The method of claim 2 wherein at least some of the infra red absorbing heat sink material is uniformly admixed with the photoconductive material.

5. The method of claim 2 wherein at least some of the infra red absorbing heat sink material is present as relatively large discrete particles or shaped pieces, non-uniformly admixed with the photoconductive material.

6. The method of claim 3 wherein the infra red absorbing component is non-uniformly admixed with said photoconductive material.

7. The method of claim 4 wherein the non-volatile infra red-absorbing heat sink material is at least one member selected from the group consisting of quartz, nickel, stainless steel, or ceramic pellets or particles, the average diameter of which is greater than that of the particles of inorganic photoconductive material.

8. The method of claim 5 wherein the non-volatile infra red absorbing heat sink material is at least one member selected from the group consisting of quartz, nickel, stainless steel, and ceramic pellets or particles, the average diameter of which are greater than that of particles of the inorganic photoconductive material.

9. A method for controlling batch coating by vacuum deposition of one or more selenium or tellurium containing photoconductive components onto a suitable xerographic substrate or base in conjunction with at least one infra red heating device, comprising substantially incorporating about 1–50% by weight of quartz particles on or within the body of said photoconductive components being evaporated.

10. A crucible for vacuum coating one or more vaporizable inorganic photoconductive materials in conjunction with at least one infrared heating means, said crucible consisting essentially of walls and a bottom element of non-contamination heat resistant materials and a plurality of non-volatile infrared absorbing rods, baffles or projections of the same or different materials arranged at an angle of 90° or less to the horizontal.

11. The crucible of claim 10 containing one or more infrared absorbing baffles attached in a general vertical position with respect to the bottom element.

12. The crucible of claim 10 wherein the rods, baffles or projections comprise one or more of quartz, nickel, stainless steel or ceramic materials.

* * * * *